(12) United States Patent
Noguchi

(10) Patent No.: US 6,504,245 B1
(45) Date of Patent: Jan. 7, 2003

(54) SEMICONDUCTOR DEVICE

(75) Inventor: Takashi Noguchi, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/697,282

(22) Filed: Oct. 27, 2000

(30) Foreign Application Priority Data

May 24, 2000 (JP) ........................................ 2000-152246

(51) Int. Cl.⁷ .............................................. H01L 23/48

(52) U.S. Cl. .................. 257/737; 257/668; 257/738; 257/778; 257/779

(58) Field of Search ................... 257/738, 778, 257/779, 668, 737; 361/764, 767, 768

(56) References Cited

U.S. PATENT DOCUMENTS

| | | | | |
|---|---|---|---|---|
| 5,668,405 A | * | 9/1997 | Yamashita | 257/668 |
| 5,977,633 A | | 11/1999 | Suzuki et al. | |
| 6,014,318 A | * | 1/2000 | Takeda | 361/764 |
| 6,028,358 A | * | 2/2000 | Suzuki | 257/737 |
| 6,031,292 A | * | 2/2000 | Murakami et al. | 257/778 |

* cited by examiner

*Primary Examiner*—Richard Elms
*Assistant Examiner*—Douglas Menz
(74) *Attorney, Agent, or Firm*—Rabin & Berdo, P.C.

(57) ABSTRACT

It is the object of the present invention to provide a semiconductor device capable of ensuring bonding strength without applying an excessive stress to solder balls and having a high degree of reliability. A substrate made of metal for the purposes of making an electric wiring circuit and taking heat radiation into account has recessed portions on one surface opposite to the other surface to which solder balls are bonded.

13 Claims, 11 Drawing Sheets

SEMICONDUCTOR DEVICE

BACKGROUND OF THE INVENTION

The present invention relates to a semiconductor device and, in particular, to the structure of a ball grid array (hereinafter referred to as BGA) package of the cavity down type, taking heat radiation into account.

As a conventional technology in this field, for example, the following technology has been proposed. FIG. 16 is a plan view of a conventional cavity down type BGA package taking heat radiation into account and FIG. 17 is a cross sectional view taken on a line E—E in FIG. 16.

For the purposes of making an electric wiring circuit and taking heat radiation into account, for example, a stepwise drawn substrate 1 made of a copper plate or the like is prepared, as shown in these drawings. An IC chip 3 is bonded to the drawn portion 1a of the stepwise drawn substrate 1 via an adhesive 2. The electrodes 4 of the IC chip 3 are electrically connected, or wire-bonded, to the electrodes 5 of the stepwise drawn substrate 1 with metal thin wires 6. Then, a sealing material 7 such as epoxy resin or the like is applied thereto and solder balls 8, which are to be terminals, are bonded like a grid to the surface 1b of the substrate by a heating step.

SUMMARY OF THE INVENTION

As is shown in FIG. 18 to FIG. 20, the conventional BGA package described is bonded to the substrate of a device, that is, a so-called mother board 9. If this BGA package is exposed to an environment having variations in temperature, stress is concentrated between the solder balls 8 and the drawn substrate 1 by the difference in the thermal expansion coefficient between the mother board 9 and the drawn substrate 1, as shown by arrows in FIG. 19, and may produce a crack. Finally, as shown in FIG. 20, a solder ball 8 may become completely separated from the drawn substrate 1.

This stress is generally concentrated on the corner of the solder ball 8. Also, the stress increases from the center of the BGA package to the outer side because of the geometric moment of inertia. If the solder ball 8 is separated from the substrate 1 in this manner, there is presented a problem in that electric conduction is interrupted.

Also, in order to solve this problem, making the substrate of the BGA package side thin or soft has been tried, but various problems have been presented: that is, the substrate is apt to be warped or deformed; it is difficult to draw the substrate; and when a semiconductor device is mounted on a mother board, solder balls are floated to bring faulty connection between them.

In view of the problems described above, the present invention has been made, and it is the object of the present invention to provide a semiconductor device capable of ensuring adequate bonding strength without applying excessive stress to the solder balls, and having a high degree of reliability.

In order to solve the above problems, according to a first aspect of the present invention, there is provided a semiconductor device comprising a substrate made of metal for the purposes of making an electric wiring circuit and taking heat radiation into account, in which the substrate has recessed portions on one surface opposite to the other surface to which solder balls are bonded.

The recessed portions may be gradually deeper from the center to the outer side. Also, in the above semiconductor device, the recessed portions may be formed in the regions on the diagonals of the substrate. Also, in the above semiconductor substrate, the recessed portions may be formed like steps on the whole surface of the substrate such that they are gradually deeper from the center to the outer side.

Further, in accordance with the second aspect of the present invention, there is provided a semiconductor device comprising a substrate made of metal for the purposes of making an electric wiring circuit and taking heat radiation into account, in which the substrate is made thin at the portion where solder balls are bonded and in which resin is applied to the thin portion of the substrate.

In the above semiconductor device, the thin portion of the substrate may be recessed. Also, in the above semiconductor device, the recessed portions may be formed like steps on the whole surface of the substrate such that they are gradually deeper from the center to the outer side.

According to the third aspect of the present invention, there is provided a semiconductor device comprising a substrate made of metal for the purposes of making an electric wiring circuit and taking heat radiation into account, in which a through hole is made in the center of the substrate and in which a heat radiation plate is bonded to the substrate.

Further, in accordance with the fourth aspect of the present invention, there is provided a semiconductor device comprising a circuit and taking heat radiation into account, in which a through hole is made in the center of the substrate and in which an IC chip is fixed in the through hole and in which the reverse surface of the IC chip is exposed outside.

In this connection, in the above semiconductor device according to the first to fourth aspects of the present invention, the substrate may be shaped like steps or subjected to drawing.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The preferred embodiments in accordance with the present invention will be hereinafter described in detail.

Figure 1:
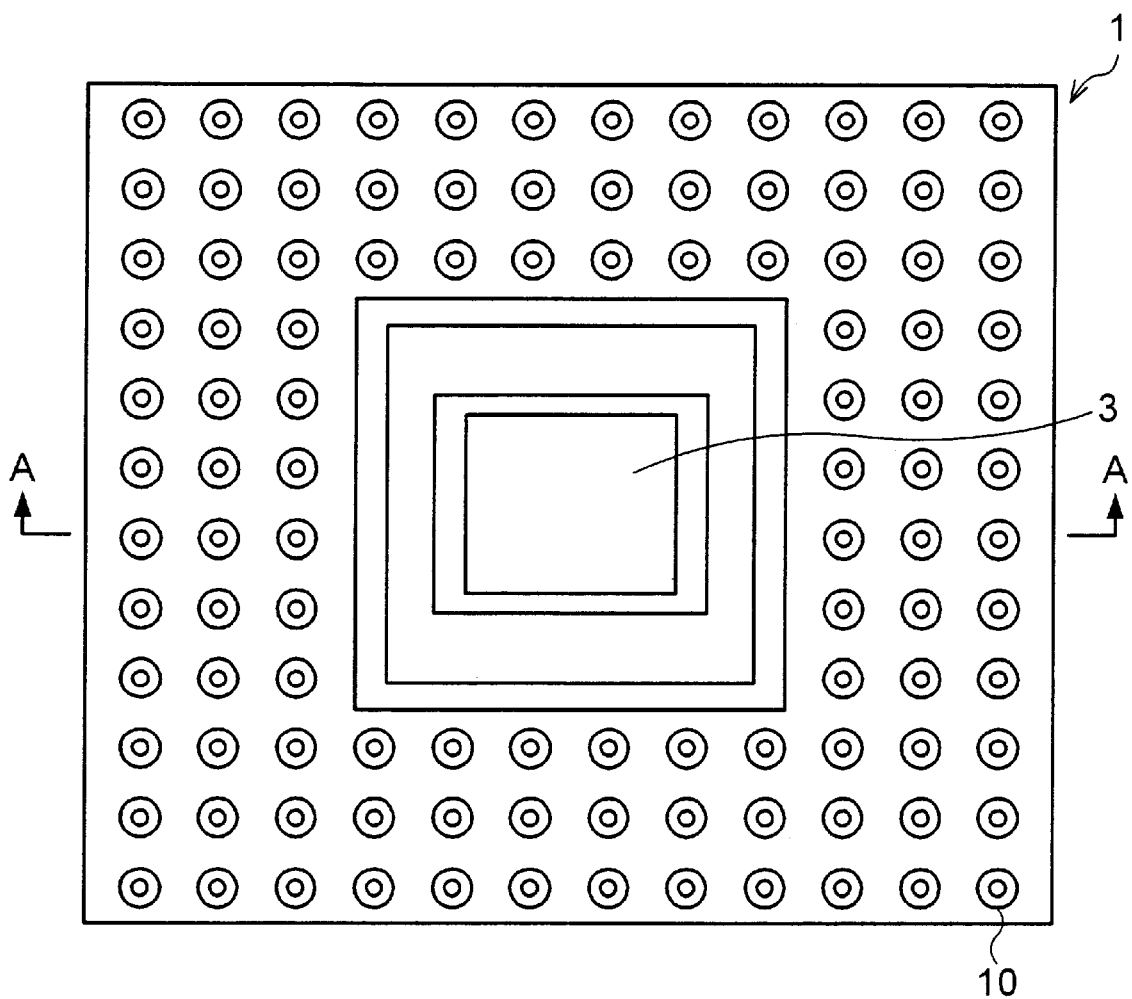
FIG. 1 is a plan view of a BGA package showing the first preferred embodiment in accordance with the present invention.
Figure 2:
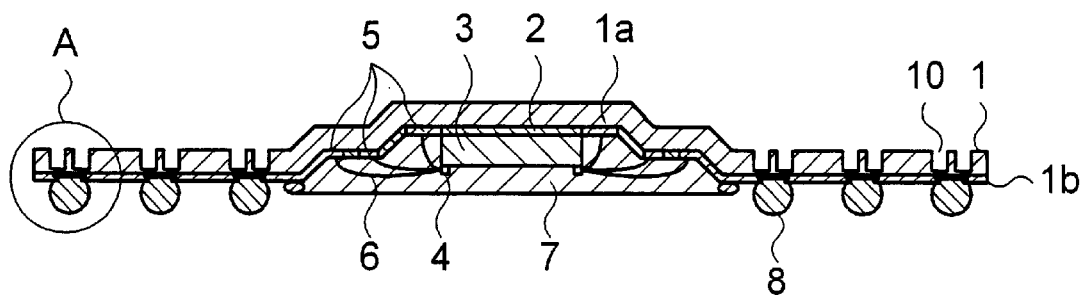
FIG. 2 is a cross sectional view taken on a line A—A in FIG. 1.
Figure 3:
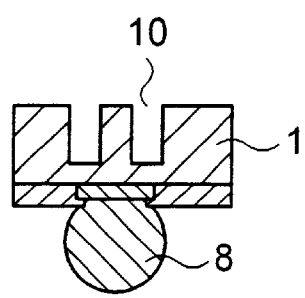
FIG. 3 is an enlarged cross sectional view of a portion A in FIG. 2.

FIG. 1 is a plan view of a BGA package showing the first preferred embodiment in accordance with the present invention. FIG. 2 is a cross sectional view taken on a line A—A in FIG. 1. FIG. 3 is an enlarged cross sectional view of a portion A in FIG. 2.

As shown in these figures, a stepwise drawn substrate 1, which is made of a copper plate or the like for the purposes of making an electric wiring circuit and taking heat radiation into account, has recessed portions 10 for relieving a stress on one surface opposite to the other surface to which solder balls 8 are bonded. An IC chip 3 is bonded to the drawn portion 1a of the stepwise drawn substrate 1 via an adhesive 2. The electrodes 4 of the IC chip 3 are electrically connected, or wire-bonded, to the electrodes 5 of the stepwise drawn substrate 1 with thin metal wires 6. Then, a sealing material 7 such as epoxy resin or the like is applied thereto and solder balls 8 to be terminals are bonded like a grid to the surface 1b of the substrate 1 by a heating process.

As shown in FIG. 3, when the recessed portion 10 is viewed in cross section, it is desirable that it is made right above the position corresponding to the corner of the solder ball 8.

Also, as methods for making the recessed portions, there are presented etching using liquid, milling using a drill and the like.

According to the first preferred embodiment having the above constitution, the stress generated by the difference in thermal expansion coefficient between a semiconductor and a mother board can be diffused without being concentrated on the corners of the solder balls 8.

Accordingly, it is possible to ensure boding strength without applying an excessive stress to the solder balls 8 and to produce a BGA package having a high degree of reliability.

Also, since the substrate can have sufficient thickness on the BGA package side, it is possible to reduce the degree of warp and deformation of the substrate and to manufacture the substrate or mount the substrate on a mother board without problems.

Figure 4:
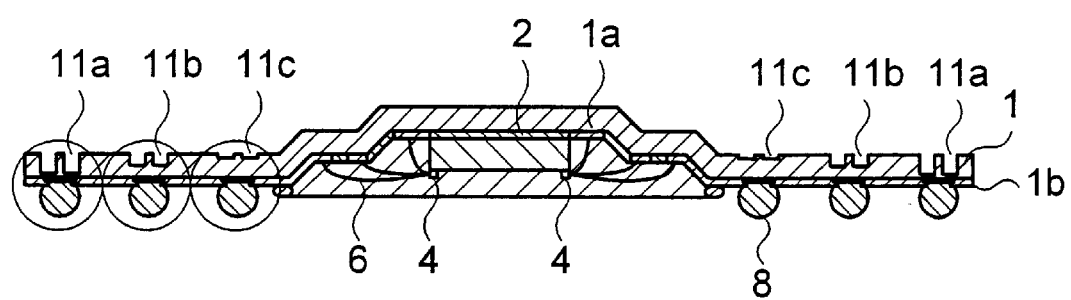
FIG. 4 is a plan view of a BGA package showing the second preferred embodiment in accordance with the present invention.
Figure 5A:
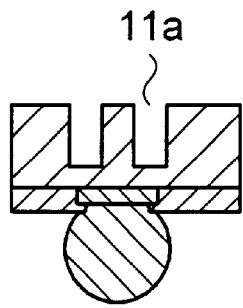
FIGS. 5(a), 5(b), and 5(c) are cross sectional views showing the shape of a recessed portion of the drawn substrate of a BGA package in accordance with the second preferred embodiment of the present invention.
Figure 5B:
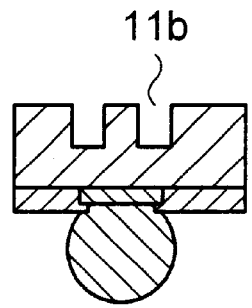
Figure 5C:
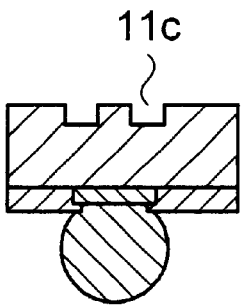

Next, the second preferred embodiment in accordance with the present invention will be described. FIG. 4 is a plan view of a BGA package showing the second preferred embodiment in accordance with the present invention, and FIGS. 5(a), 5(b), and 5(c) are cross sectional views showing the shape of a recessed portion of the drawn substrate of the BGA package. FIG. 5(a) to FIG. 5(c) are cross sectional views showing the shapes of the recessed portions made in sequence on the substrate from the outer side to the center. In this connection, like reference characters are attached to like parts in the first preferred embodiment and the description for the like parts will be omitted.

As shown in FIG. 4 and FIGS. 5(a)–5(c), the BGA package of this preferred embodiment has recessed portions 11c to 11a, which are gradually deeper from the center of the substrate 1 to the outer side. In this case, a deepest recessed portion 11a, a deeper recessed portion 11b and a deep recessed portion 11c are formed according to the magnitude of the stress produced by the moment inertia of area, that is, the constitution of the recessed portions corresponds to the difference in stress produced by the magnitude of the geometric moment of inertia.

As described above, according to the second preferred embodiment, it is possible to further reduce the degree of warp or deformation in addition to the effects produced by the first preferred embodiment.

Figure 6:
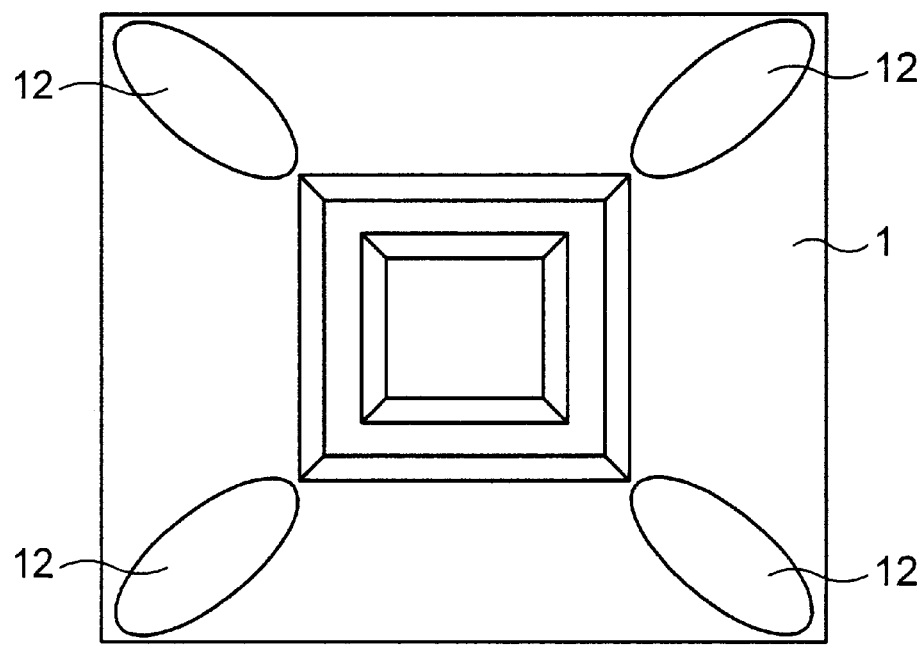
FIG. 6 is a plan view of a BGA package showing the third preferred embodiment in accordance with the present invention.

Next, the third preferred embodiment in accordance with the present invention will be described. FIG. 6 is a plan view of a BGA package showing the third preferred embodiment in accordance with the present invention. In this connection, this preferred embodiment is the same as the first preferred embodiment or the second preferred embodiment except for the following point and the description for the same parts will be omitted.

As shown in FIG. 6, the recessed portions shown in the first preferred embodiment or the second preferred embodiment are formed only in the regions 12 on the diagonals of the stepwise drawn substrate 1. Therefore, the constitution of the recessed portions corresponds to a difference in stress produced by the geometric moment of inertia. Also, in addition to the effects produced by the first preferred embodiment and the second preferred embodiment, the present third preferred embodiment can produce an effect of easily making the recessed portions because the regions where the recessed portions are formed are reduced.

Figure 7:
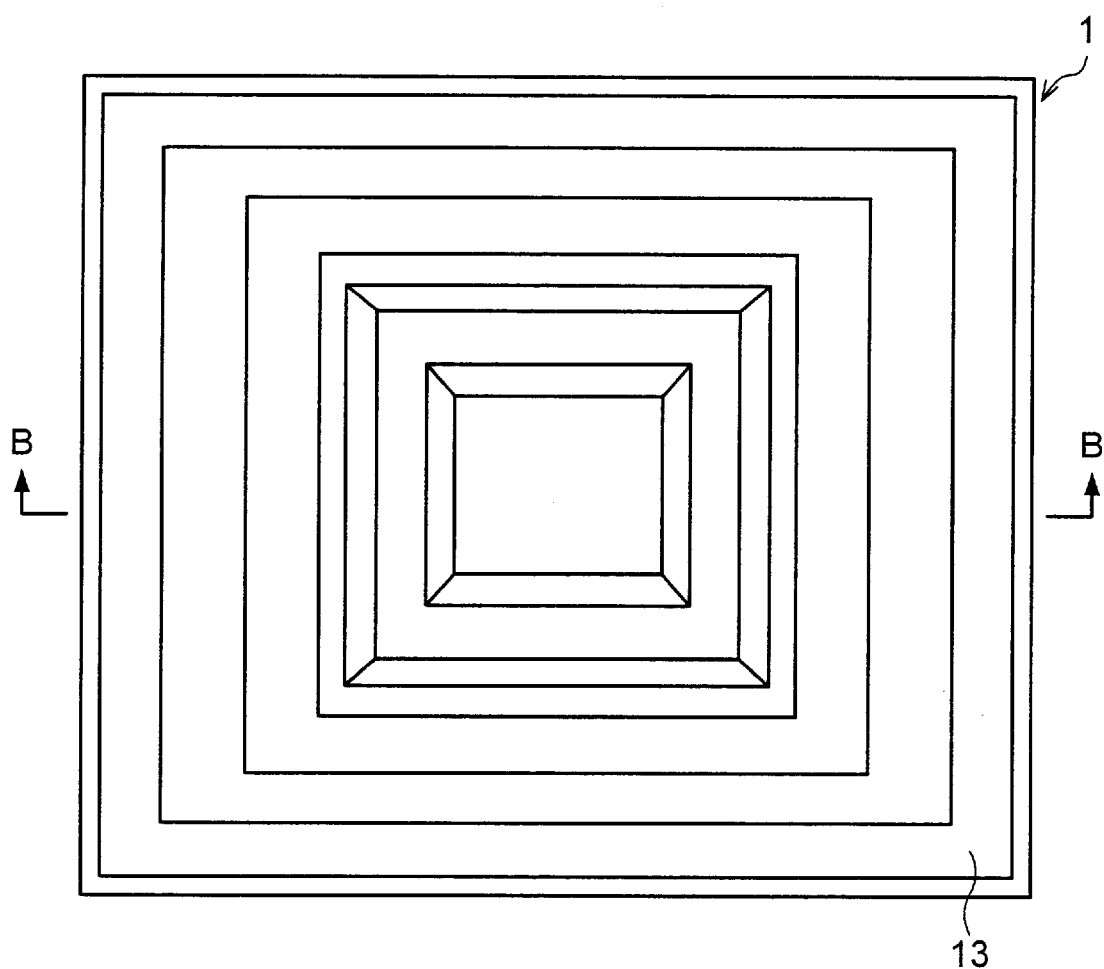
FIG. 7 is a plan view of a BGA package showing the fourth preferred embodiment in accordance with the present invention.
Figure 8:
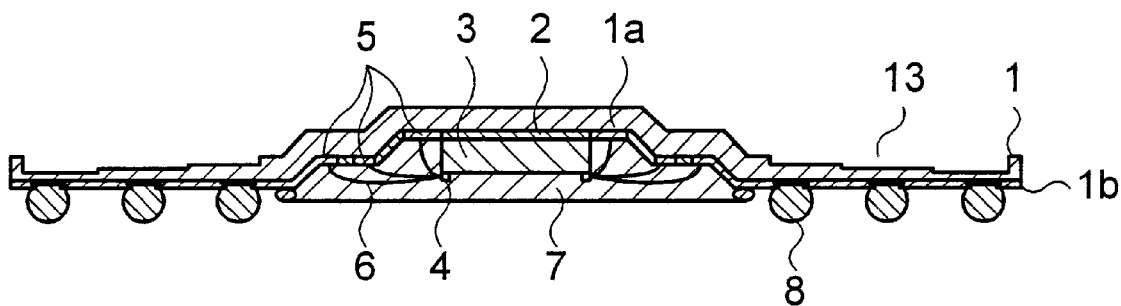
FIG. 8 is a cross sectional view taken on a line B—B in FIG. 7.

Next, the fourth preferred embodiment in accordance with the present invention will be described. FIG. 7 is a plan view of a BGA package showing the fourth preferred embodiment in accordance with the present invention. FIG. 8 is a cross sectional view taken on a line B—B in FIG. 7. In this respect, the fourth preferred embodiment is the same as the first preferred embodiment except for the following point and the description for the same parts will be omitted.

As shown in FIG. 8, a recessed portion 13 is formed on the whole surface of the stepwise drawn substrate 1. The depth of the recessed portion 13 is made stepwise deeper from the inner side to the outer side. That is, the constitution of the recessed portion 13 corresponds to a difference in stress produced by the geometric moment of inertia. This constitution, therefore, produces an effect of further relieving the stress in addition to the effects of the second preferred embodiment.

Figure 9:
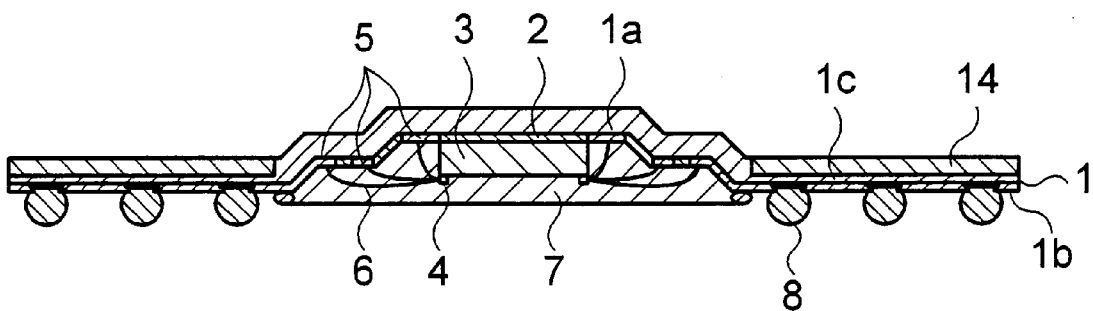
FIG. 9 is a cross sectional view of a BGA package showing the fifth preferred embodiment in accordance with the present invention.

Next, the fifth preferred embodiment in accordance with the present invention will be described. FIG. 9 is a cross sectional view of a BGA package showing the fifth preferred embodiment in accordance with the present invention.

As shown in FIG. 9, a stepwise drawn substrate 1 made of a copper plate or the like for the purposes of making an electric wiring circuit and taking heat radiation into account is made thin at the substrate portion 1c to which solder balls 8 are bonded. A stress relieving resin 14 such as epoxy resin or the like is uniformly applied to the portion except for the drawn portion 1a and an IC chip 3 is bonded to the drawn portion 1a via an adhesive 2. The electrodes 4 of the IC chip 3 are electrically connected, or wire-bonded to the electrodes 5 of the drawn substrate 1 with thin metal wires 6. Then, a sealing material 7 such as epoxy resin or the like is applied thereto and the solder balls 8 are bonded like a grid to the surface 1b of the drawn substrate 1 by a heating process.

The thermal expansion coefficient of the BGA package is changed to be nearly equal to the thermal expansion coefficient of the mother board by applying the stress relieving resin 14 to the region of the solder balls 8 in this manner.

As described above, according to the fifth preferred embodiment, it is possible to ensure bonding strength and to constitute a package having a high degree of reliability without applying an excessive stress to the solder balls 8.

Also, since the whole thickness of the package can be ensured, it is possible to prevent the warp or deformation of the package and to manufacture the substrate and to mount the device on the mother board without any problem.

Figure 10:
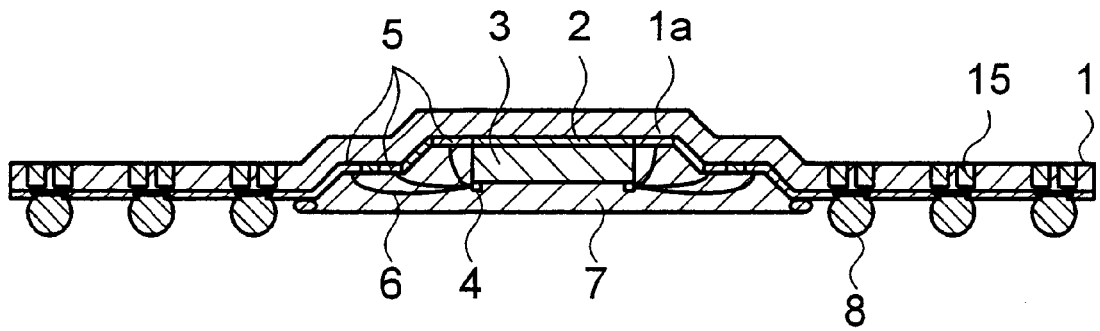
FIG. 10 is a cross sectional view of a BGA package showing the sixth preferred embodiment in accordance with the present invention.

Next, the sixth preferred embodiment in accordance with the present invention will be described. FIG. 10 is a cross sectional view of a BGA package showing the sixth preferred embodiment in accordance with the present invention. The sixth preferred embodiment is the same as the fifth preferred embodiment except for the following point and the description for the same parts will be omitted.

As shown in FIG. 10, when the package is viewed in cross section, recessed portions are made at the portions of the drawn substrate 1 corresponding to the corners of the solder balls 8. The recessed portions are filled with epoxy resin or the like to make filled portions 15.

According the sixth preferred embodiment having a constitution like this, when temperature is varied, it is possible to diffuse stress produced by a difference in the thermal expansion coefficients between a semiconductor and a mother board without being concentrated on the corners of the solder balls 8 when temperature is varied and, further, to reduce the degree of warp or deformation.

Figure 11:
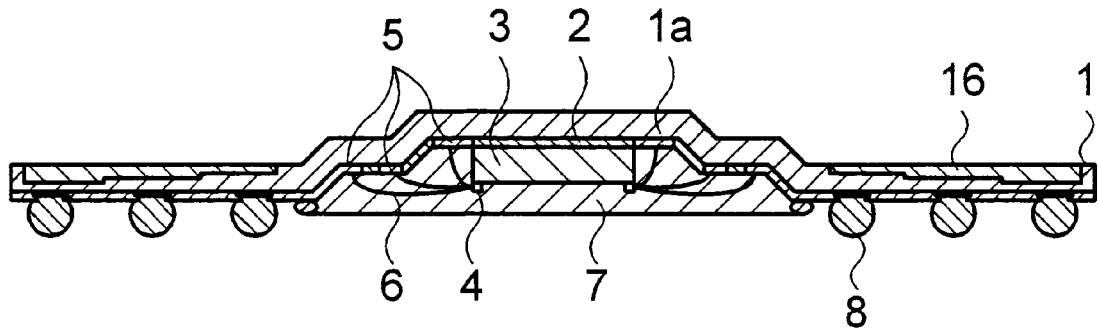
FIG. 11 is a cross sectional view of a BGA package showing the seventh preferred embodiment in accordance with the present invention.

Next, the seventh preferred embodiment in accordance with the present invention will be described. FIG. 11 is a cross sectional view of a BGA package showing the seventh preferred embodiment in accordance with the present invention. The seventh preferred embodiment is the same as the fifth preferred embodiment except for the following point and the description for the same parts will be omitted.

As shown in FIG. 11, a recessed portion shaped like steps is made on the whole surface of a package and is filled with epoxy resin or the like to form a filled portion 16. This constitution, therefore, can respond to a change in stress caused by a difference in the geometric moment of inertia, and can produce an effect of easily manufacturing the drawn substrate 1 in addition to the effects of the sixth preferred embodiment.

Figure 12:
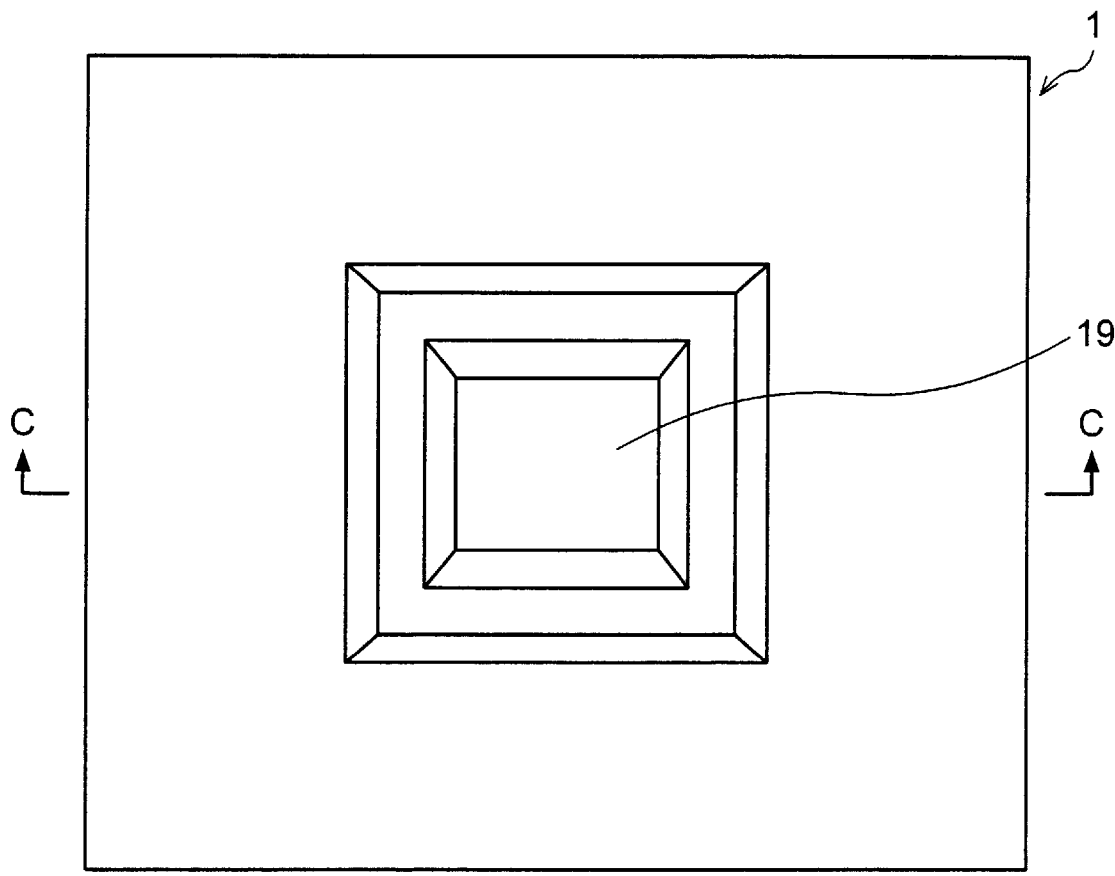
FIG. 12 is a plan view of a BGA package showing the eighth preferred embodiment in accordance with the present invention.
Figure 13:
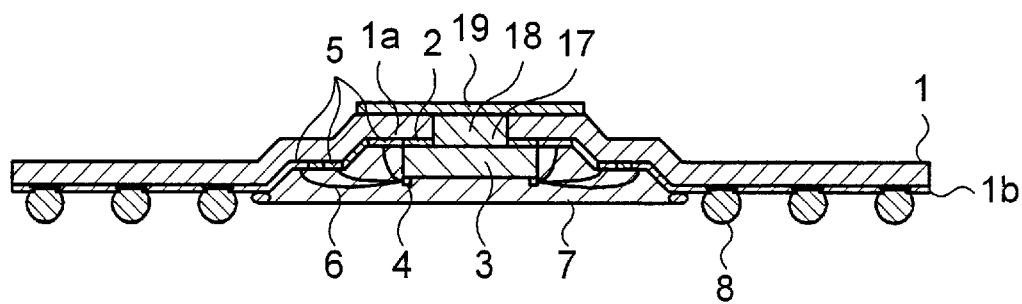
FIG. 13 is a cross sectional view taken on a line C—C in FIG. 12.

Next, the eighth preferred embodiment in accordance with the present invention will be described. FIG. 12 is a plan view of a BGA package showing the eighth preferred embodiment in accordance with the present invention, and FIG. 13 is a cross sectional view taken on a line C—C in FIG. 12.

As shown in these figures, a through hole 17 is made in the center of a stepwise drawn substrate 1 made of a copper plate or the like for the purposes of making an electric wiring circuit and taking heat radiation into account. An IC chip 3 is bonded to the drawn portion 1a of the stepwise drawn substrate 1 via an adhesive 2. The IC chip 3 is bonded to a heat radiating plate 19 via resin 18 filled in the through hole 17 and having good heat radiation property. The electrodes 4 of the IC chip 3 are electrically connected, or wire-bonded, to the electrodes 5 of the stepwise drawn substrate 1 with thin metal wires 6. Then, a sealing material 7 such as epoxy resin or the like is applied thereto and solder balls 8 to be terminals are bonded like a grid to the surface 1b of the stepwise drawn substrate 1 by a heating process.

According to the eighth preferred embodiment in which the through hole is made in a part (center) of the stepwise drawn substrate 1, it is possible to reduce the degree of deformation caused by heat.

Therefore, it is possible to ensure bonding strength without applying an excessive stress to the solder balls 8 and hence to produce a package having a high degree of reliability, and further to improve heat radiation generated by the IC chip 3.

Figure 14:
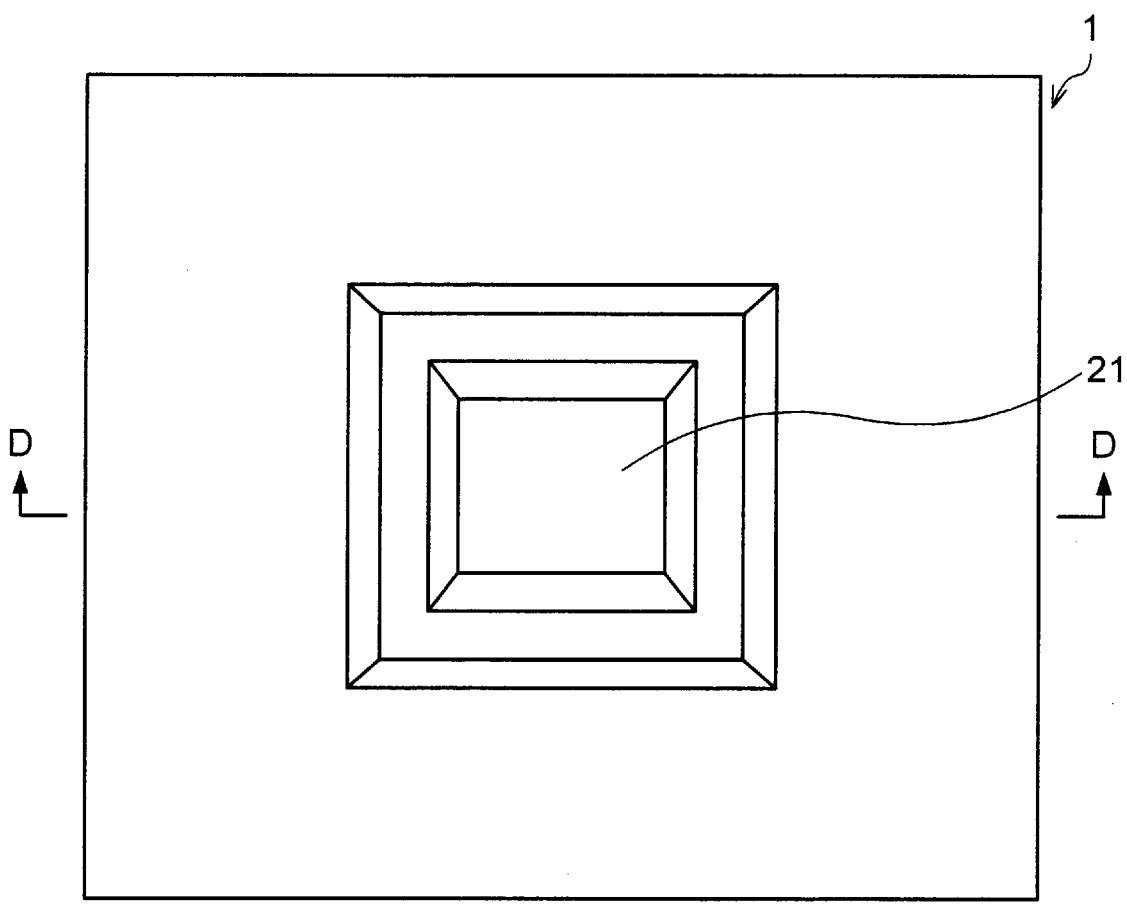
FIG. 14 is a plan view of a BGA package showing the ninth preferred embodiment in accordance with the present invention.
Figure 15A:
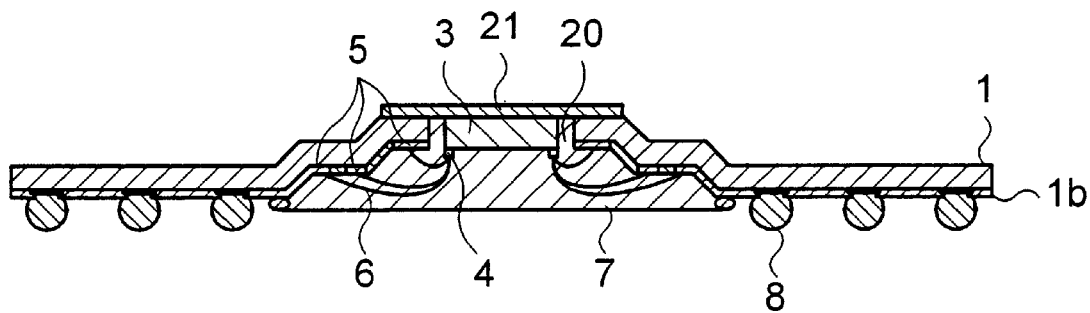
FIGS. 15(a) and 15(b) illustrate a manufacturing process in cross sectional views taken on a line D—D in FIG. 14.
Figure 15B:
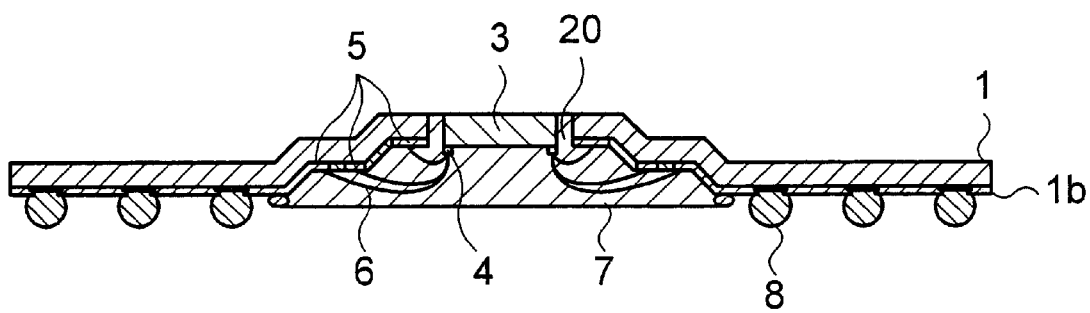
Figure 16:
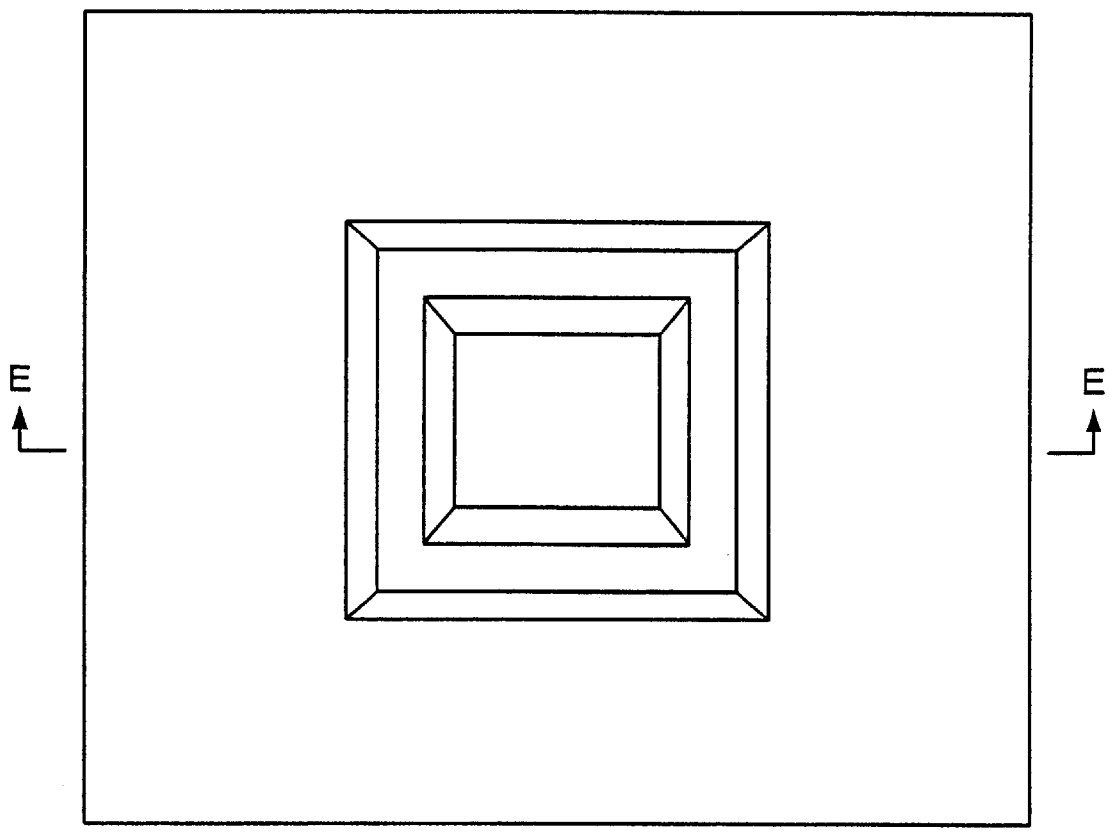
FIG. 16 is a plan view of a conventional BGA package of cavity down type taking heat radiation into account.
Figure 17:
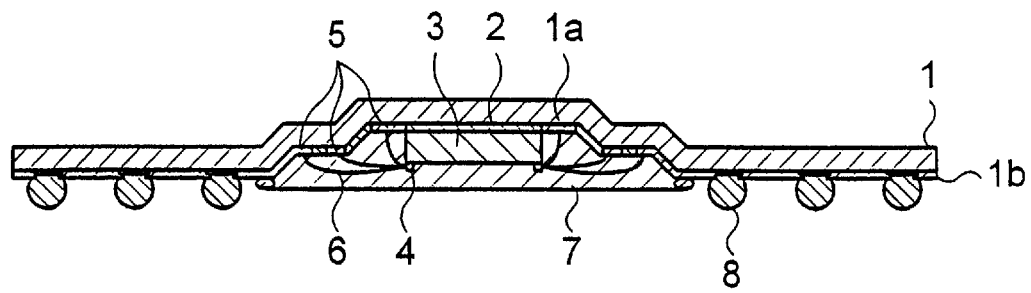
FIG. 17 is a cross sectional view taken on a line E—E in FIG. 16.
Figure 18:
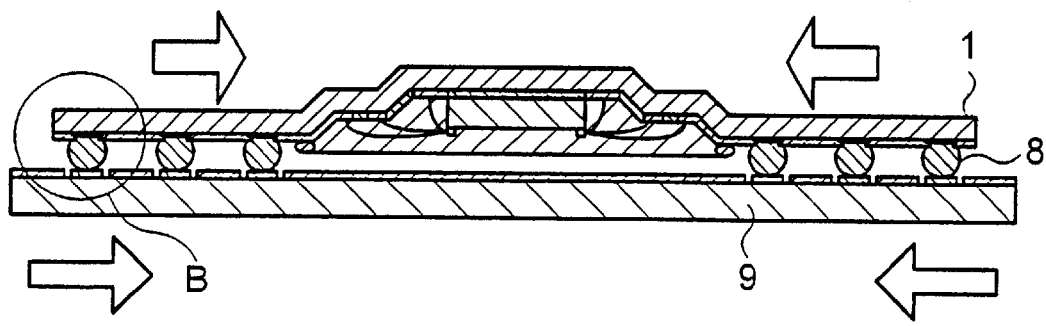
FIG. 18 is a cross sectional view taken on a line E—E in FIG. 16.
Figure 19:
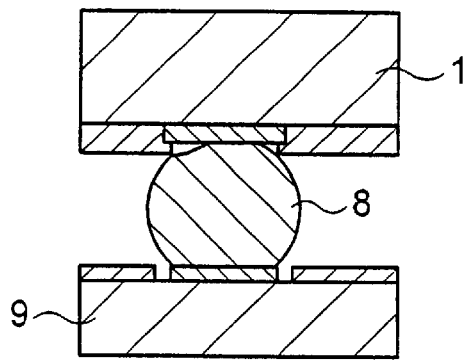
FIG. 19 is an enlarged cross sectional view of a portion B in FIG. 18.
Figure 20:
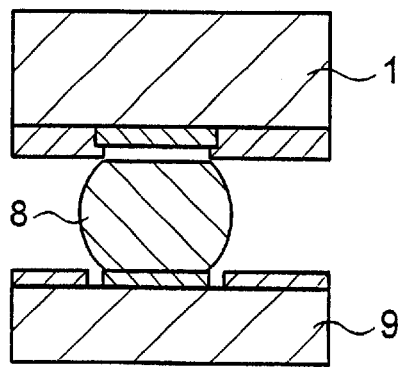
FIG. 20 is an illustration showing the separation of a solder balls which is a problem with the conventional package.

Next, the ninth preferred embodiment in accordance with the present invention will be described. FIG. 14 is a plan view of a BGA package showing the ninth preferred embodiment in accordance with the present invention. FIGS. 15($a$) and 15($b$) show a manufacturing process in cross sectional views taken on a line D—D in FIG. 14, and FIG. 15($a$) shows a first stage of the process and FIG. 15($b$) shows a second stage of the process.

As shown in these figures, a through hole 20 is made in the center of a stepwise drawn substrate 1 made of a copper plate for the purposes of making an electric wiring circuit and taking heat radiation into account. An IC chip 3 is fixed in the through hole 20. The electrodes 4 of the IC chip 3 are electrically connected, or wire-bonded, to the electrodes 5 of the stepwise drawn substrate 1 with thin metal wires 6. Then, a sealing material 7 such as epoxy resin or the like is applied thereto and solder balls 8 to be terminals are bonded like a grid to the surface 1b of the stepwise drawn substrate 1 by a heating process.

As a method for fixing the IC chip 3 in the through hole 20, the following procedure may be employed. As shown in FIG. 15($a$), for example, an adhesive tape 21 having heat resistance is previously placed on the through hole 20 and then the IC chip 3 is fixed on the tape 21. The electrodes 4 of the IC chip 3 are electrically connected, or wire-bonded, to the electrodes 5 of the stepwise drawn substrate 1 with thin metal wires 6. Then, a sealing material 7 such as epoxy resin or the like is applied thereto and after the sealing material 7 solidifies, the tape 21 is removed as shown in FIG. 15($b$).

Since a part of the drawn substrate is removed, the degree of deformation of the package caused by heat can be reduced. Therefore, it is possible to ensure bonding strength without applying excessive stress to the solder balls 8 and to produce a BGA package having a high degree of reliability.

Also, since the reverse surface of the IC chip 3 is exposed outside, the BGA package is excellent in heat radiation. Further, the reverse surface of the IC chip is ground to ensure the thickness of the package in the direction of thickness, that is, so-called back grinding is performed, but this back grinding process can be omitted to reduce the number of manufacturing processes. Also, the same manufacturing process as is used in manufacturing a CIB (chip in board) can be used.

The present invention has the following other modifications. While the recessed portion is shaped like a rectangle in the first preferred embodiment, it is not intended to limit the present invention to this shape. Also, the number of the steps or changes in depth is three in the second, fourth, and seventh preferred embodiments, but it is not intended to limit the number of the steps to three. Further, the regions having the recessed portions are shaped like ellipsoids in the third preferred embodiment, but it is not intended to limit the shapes of the regions to an ellipsoid. Still further, it is not intended to limit the shape and the position of the through hole in the eighth and ninth preferred embodiments to those described above.

In this connection, it is not intended to limit the present invention to the preferred embodiments described above. On the contrary, the present invention can be further modified based on the spirit and scope of the present invention and it is intended to cover all alternatives, modifications, equivalents as may be included within the spirit and scope of the invention.

As described above in detail, according to the present invention, the following effects can be produced: bonding strength can be ensured without applying an excessive stress to the solder balls and a semiconductor device having a high degree of reliability can be produced.

To be more specific, a stress produced by a difference in the thermal expansion coefficients between a semiconductor and a mother board can be diffused without being concentrated on the corners of the solder balls when temperatures are varied.

Also, if the recessed portion is made deep at the position where the stress produced by the geometric moment of inertia is large and it is made shallow at the position where the stress produced by the geometric moment of inertia is small, the recessed portion can be correspond to a difference in the stress caused by the geometric moment of inertia.

Also, if the recessed portions are formed only in the regions on the diagonals of the stepwise drawn substrate, the constitution of the recessed portions corresponds to a difference in the stress produced by the geometric moment of inertia. In this case, the recessed portions can be easily made because the regions where the recessed portions are formed are reduced.

Also, if the recessed portion is made deep at the position where the stress produced by the geometric moment of inertia is large and it is made shallow at the position where the stress produced by the geometric moment of inertia is small, the recessed portions can correspond to a difference in the stress caused by the geometric moment of inertia. In this case, the degree of warp and deformation of the package can be reduced.

Further, if the stress relieving resin is applied to the region of the solder balls, the thermal expansion coefficient of the BGA package is changed to be nearly equal to the thermal expansion coefficient of the mother board. Therefore, it is possible to ensure bonding strength and to constitute a package having a high degree of reliability without applying an excessive stress to the solder balls. In this case, since the whole thickness of the package can be ensured, it is possible to prevent the warp or deformation of the package and to manufacture the substrate and to mount the device on the mother board without any problem.

Also, when the package is viewed in cross section, the recessed portions are made at the portions of the drawn substrate corresponding to the corners of the solder balls. The recessed portions are filled with epoxy resin or the like to make filled portions. Therefore, when temperatures are varied, it is possible to diffuse the stress produced by a difference in the thermal expansion coefficients between the semiconductor and the mother board without being concentrated on the corners of the solder balls and further, to reduce the degree of warp or deformation of the package.

Also, the recessed portion shaped like steps is made on the whole surface of the package and is filled with epoxy resin or the like to form the filled portion. This constitution, therefore, can respond to a change in stress caused by the difference in the geometric moment of inertia, and the drawn substrate can be easily manufactured.

Further, if the through hole is made in a part (center) of the stepwise drawn substrate, it is possible to reduce the degree of deformation caused by heat. Therefore, it is possible to ensure bonding strength without applying excessive stress to the solder balls and hence to produce the package having a high degree of reliability, and further to improve heat radiation generated by the IC chip.

Still further, if a part of the drawn substrate is removed, the degree of deformation of the package caused by heat can be reduced. Therefore, it is possible to ensure bonding strength without applying excessive stress to the solder balls 8 and to produce the BGA package having a high degree of reliability. In this case, since the reverse surface of the IC chip 3 is exposed outside, the BGA package is excellent in heat radiation. Further, the reverse surface of the IC chip is ground to ensure the thickness of the package in the direction of thickness, that is, so-called back grinding is performed, but this back grinding process can be removed to reduce the number of manufacturing processes.

The entire disclosure of Japanese Patent Application No. 2000-152246, filed on May 24, 2000, including the specification, claims, drawings and summary, is incorporated herein by reference in its entirety.

What is claimed is:

1. A semiconductor device comprising:
a substrate that comprises metal;
a semiconductor chip mounted at said substrate; and
solder balls mounted at said substrate,
wherein said substrate has a thickness, over an area where said solder balls are provided, that is set to be greater than zero directly over said solder balls but smaller than the thickness of said substrate in an area where said semiconductor chip is mounted.

2. A semiconductor device as claimed in claim 1, wherein:
said substrate has indented portions, at a surface thereof opposite from a surface where said solder balls are provided.

3. A semiconductor device according to claim 2, wherein:
said substrate has undergone a drawing process to form stages so as to allow said substrate to include a hollow, said semiconductor chip being mounted at said hollow and said solder balls being provided at a periphery of said semiconductor chip.

4. A semiconductor device according to claim 2, wherein:
said substrate has a center, and said indented portions of said substrate have a depth that gradually increases from the center of said substrate toward the outside.

5. A semiconductor device according to claim 2, wherein:
said substrate is generally rectangular in shape and has diagonals, and said indented portions are provided over areas set on the diagonals of said substrate.

6. A semiconductor device according to claim 2, wherein:

said indented portions achieve a step-like shape, with said indented portions having a depth that gradually increases from the inside toward the outside over the entire surface of said substrate.

7. A semiconductor device according to claim 1, wherein:

said substrate includes a processed portion having an area where said solder balls are provided, said area having a thickness that is reduced relative to the thickness of an area where said semiconductor chip is mounted, and a resin is applied onto said processed portion.

8. A semiconductor device according to claim 7, wherein:

said processed portion is an indented portion.

9. A semiconductor device according to claim 7, wherein:

said processed portion achieves a step-like shape, with said processed portion having a depth that gradually increases from the inside toward the outside over the entire surface of said substrate.

10. A semiconductor device comprising:

a semiconductor chip;

a plurality of solder balls; and a substrate having a central region where said semiconductor chip is mounted and having a peripheral region around said central region, said peripheral region of said substrate having a bottom side where said solder balls are mounted, said substrate comprising a metal element having a thickness which varies in said peripheral region but which is greater than zero directly over said solder balls.

11. A semiconductor device according to claim 10, wherein said metal element is thicker directly over some of said solder balls than it is directly over others of said solder balls.

12. A semiconductor device according to claim 10, wherein said central region of said substrate has a cavity, said semiconductor chip being mounted in said cavity.

13. A semiconductor device according to claim 10, wherein said central region of said substrate has a through hole in which said semiconductor chip is mounted.

* * * * *